United States Patent
Youngman et al.

(10) Patent No.: US 7,584,437 B2
(45) Date of Patent: Sep. 1, 2009

(54) ASSURING CORRECT DATA ENTRY TO GENERATE SHELLS FOR A SEMICONDUCTOR PLATFORM

(75) Inventors: Todd Jason Youngman, Rochester, MN (US); John Emery Nordman, Rochester, MN (US); Daniel Dean Ortmann, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 863 days.

(21) Appl. No.: 10/840,534

(22) Filed: May 6, 2004

(65) Prior Publication Data
US 2005/0251772 A1    Nov. 10, 2005

(51) Int. Cl.
G06F 17/50    (2006.01)
(52) U.S. Cl. .................... 716/1; 716/5; 716/18
(58) Field of Classification Search ............ 716/1, 716/3, 5, 6, 18
See application file for complete search history.

(56) References Cited

U.S. PATENT DOCUMENTS 5,844,818 A    12/1998    Kochpatcharin et al.
6,470,482 B1    10/2002    Rostoker et al.
7,100,133 B1 *    8/2006    Meiyappan et al. ............ 716/5

* cited by examiner

Primary Examiner—Vuthe Siek
(74) Attorney, Agent, or Firm—Suiter Swantz pc llo

(57) ABSTRACT

A method, system, and a computer program product to provide correct and complete input into a shell generation tool that provides the infrastructure for design and development of an integrated circuit. Given a definition of a platform, in part a partially manufactured semiconductor product having some diffused and some configurable resources, a user can enter data that is correct and complete into the shell generation tool using several techniques. The tool itself can present data for the user to select that is complete and correct, i.e., the data, inter alia, has no syntactic or other errors of an HDL, satisfies the constraints and naming conventions required by the tool, a customer of the semiconductor product, and/or the entity designing the product, provides appropriate timing and voltage levels, and is otherwise compatible with other data in the generation tool. If a user inputs data into an entry field, the tool automatically validates the input data by invoking one or more algorithms to determine its correctness and completeness before entering the data for shell generation.

15 Claims, 9 Drawing Sheets

ASSURING CORRECT DATA ENTRY TO GENERATE SHELLS FOR A SEMICONDUCTOR PLATFORM

FIELD OF THE INVENTION

This invention relates generally to the field of electronic circuit design and more particularly relates to optimizing the creation of correct shells for a semiconductor platform during the design/development of integrated circuits by providing an apparatus and method assuring correct input.

BACKGROUND

Integrated circuits comprise many transistors and the electrical interconnections between them. Depending upon the interconnection topology, transistors perform Boolean logic functions like AND, OR, NOT, NOR and are referred to as gates. Some fundamental anatomy of an integrated circuit will be helpful for a full understanding of the factors affecting the flexibility and difficulty to design an integrated circuit. An integrated circuit comprises layers of a semiconductor, usually silicon, with specific areas and specific layers having different concentrations of electron and hole carriers and/or insulators. The electrical conductivity of the layers and of the distinct areas within the layers is determined by the concentration of dopants within the area. In turn, these distinct areas interact with one another to form transistors, diodes, and other electronic devices. These specific transistors and other devices may interact with each other by field interactions or by direct electrical interconnections. Openings or windows are created for electrical connections between the layers by a combination of masking, layering, and etching additional materials on top of the wafers. These electrical interconnections may be within the semiconductor or may lie above the semiconductor areas and layers using a complex mesh of conductive layers, usually metal such as platinum, gold, aluminum, tungsten, or copper fabricated by deposition on the surface and selective removal, leaving the electrical interconnections. Insulative layers, e.g., silicon dioxide, may separate any of these semiconductor or connectivity layers.

Meanwhile, several types of chips have been developed that take advantage of a modular approach having areas in which the transistors and their respective functions are fixed and other areas in which the transistors and their functions are totally or partially programmable/customizable. The different proportion of fixed to programmable modules in an integrated circuit is limited by factors such as complexity, cost, time, and design constraints. The field programmable gate array (FPGA) refers to a type of logic chip that can be reprogrammed. Because of the programmable features, FPGAs are flexible and modification is almost trivial but, on the other hand, FPGAs are very expensive and have the largest die size. The relative disadvantage of FPGAs, moreover, is its high cost per function, low speed, and high power consumption. FPGAs are used primarily for prototyping integrated circuit designs but once the design is set, faster hard-wired chips are produced. Programmable gate arrays (PGAs) are also flexible in the number of possible applications that can be achieved but are not quite as flexible as the FPGAs and are more time-consuming to modify and test. An application specific integrated circuit (ASIC) is another type of chip designed for a particular application. ASICs are efficient in use of power compared to FPGAs and are quite inexpensive to manufacture at high volumes. ASICs, however, are very complex to design and prototype because of their speed and quality. Application Specific Standard Products (ASSPs) are hard-wired chips that meet a specific need but this customization is both time-consuming and costly. An example of an ASSP might be a microprocessor in a heart pacemaker.

A digital system can be represented at different levels of abstraction to manage the description and design of complex systems with millions of logic gates, etc. For instance, a circuit diagram or a schematic of interconnected logic gates is a structural representation; a picture of a chip with pins extending from the black box/rectangle is a physical representation; and the behavioral representation, considered the highest level of abstraction, describes a system in terms of what it does, how it behaves, and specifies the relationship between the input and output signals. A behavioral description could be a Boolean expression or a more abstract description such as the data register transfer level logic (RTL). RTL descriptions are specified by the following three components: (1) the set of registers in the system or subsystem, such as a digital module; (2) the operations that are performed on the data stored in the registers; and (3) the control that supervises the sequence of the operations in the system.

Specialized electronic design automation (EDA) software, referred to as tools, intended to implement a more efficient process to design chips has been introduced. Integrated circuits are now designed with the EDA tools using hardware description languages, typically Verilog or VHDL. VHDL stands for VHSIC (Very High Speed Integrated Circuits) Hardware Description Language, the development of which was sponsored by the U.S. Department of Defense and the IEEE in the mid 1980s. VHDL and Verilog are only two hardware description languages but seem to have become the industry's standard languages to describe and simulate complex digital systems and incorporate timing specifications and gate delays, as well as describe the integrated circuit as a system of interconnected components. Execution of programs in hardware description languages are inherently parallel meaning that as soon as a new input arrives the commands corresponding to logic gates are executed in parallel. In this fashion, a VHDL or Verilog program mimics the behavior of a physical, usually digital, system.

In spite of the implementation of EDA tools, chip designers and testers still manually define the specification and address map for individual registers and internal memory, as well as separately and manually specify the implementation at the RTL, the verification testcases, and the firmware header file. Maintaining consistency and manually editing the multitude of minute modifications often required by this out-dated and tedious approach is very difficult and conducive to many mistakes. A flow chart is shown in FIG. 1 of the conventional method 100 of generating RTL for an integrated circuit. The process begins at step 110 and the user then selects an area or a logical function of the integrated circuit to develop at step 112. At step 114, the user enters RTL generation parameters, for example, the names of signals, names of inputs/outputs, etc. Then the RTL is generated at step 116, typically by a developer knowing the hardware description language who manually writes and enters the code keystroke by keystroke. After the RTL code is written, it is compiled, as in step 118 wherein the RTL language and syntax are checked for correctness at step 120. If the RTL compilation is correct, the RTL is then simulated as in step 122 to determine at step 124 if the logic of the RTL is correct. Unfortunately, it is after the RTL is not only compiled but also simulated that some problems are discovered, including those errors of data entry. Discovering problems with the RTL late in the process, such as in step 120 which find faults with the RTL language and syntax or in step 124 which finds the errors in the logic, mandates that the process return to step 114 wherein a designer/developer of the integrated circuit manually changes and/or reenters new or different RTL generation parameters, etc. keystroke by keystroke. As can be seen and being aware of human propensity for error, the conventional process of FIG. 1 requires lengthy iteration loops and can even cause further delays as each problem is be separately discovered and which may beget more errors. There is thus a need in the industry to increase the reliability of the design process of the integrated circuits while reducing the time and cost of each individual design.

SUMMARY OF THE INVENTION

To satisfy the above needs and to realize further advantages, the inventors herein present a method to enter data for the design of a semiconductor product, the method comprising the steps of reading and storing a definition of a platform from which and a customer's requirements for the semiconductor product will be designed; determining which of one or more of a plurality of shells for the design of the semiconductor product to generate; providing a field into which a user may enter data for the shell; reading the entered data; determining if the entered data is correct; and determining if the entered data, the platform definition, and/or the customer's requirements are complete. The method may further generate one or more of the following shells: an RTL shell, a simulation shell, a documentation shell, a timing shell, a manufacturing test shell, a synthesis shell, and/or a floorplan shell. For memory of a semiconductor product, the correct shell generation tool may provide an infrastructure to configure the memory into random access memory of a desired depth and width. For the I/O of a semiconductor product, the infrastructure provides correct package pin assignment for a portion or all of semiconductor product and/or configures one or more I/O buffers for one or more impedance levels, and/or enables boundary scan testing. For the clocking of the semiconductor product, the shells may provide delay matching across one or more clock signals from a same phase locked loop and/or branch gating of clock signals for one or more power modes of the semiconductor product.

The tool may offer the user and interface having acceptable and correct data from which to select given the generation task or the data entry. In addition or alternatively, the tool may provide a user interface having a field into which a user may input data. If the data is input by the user, the tool has and applies an algorithm to validate the input data by, inter alia, checking the syntax and semantics of the data against the rules of a hardware description language, or checking if the input data complies with customer and/or corporate data naming or other usage conventions.

Other aspects and features of the present invention, as defined solely by the claims, will become apparent to those ordinarily skilled in the art upon review of the following non-limited detailed description of the invention in conjunction with the accompanying figures.

DESCRIPTION OF THE INVENTION

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough, complete; and will fully convey the scope of the invention to those skilled in the art. Like numbers refer to like elements throughout.

Figure 2:
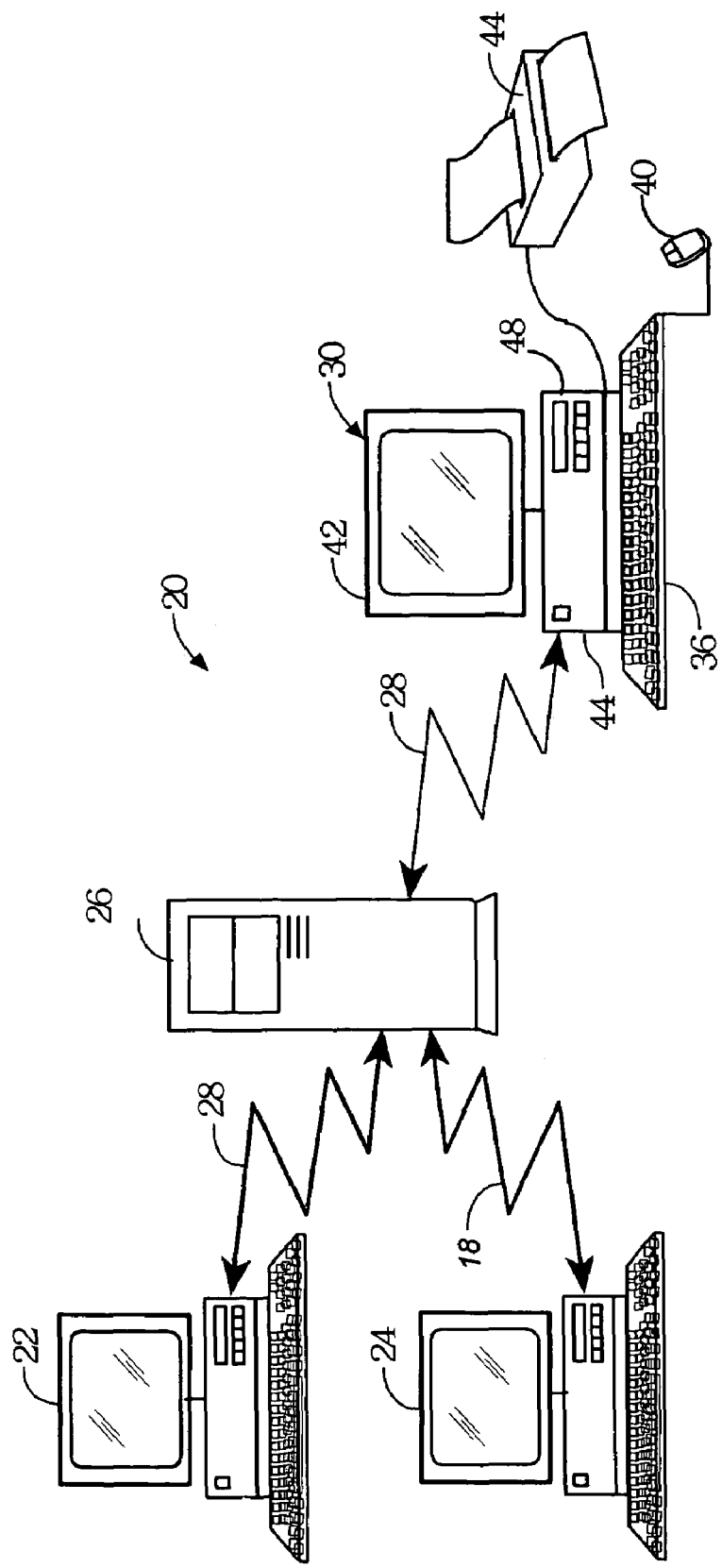
FIG. 2 is a simplified block diagram of a networked computer system in which the correct shell construction method and the tool of the invention can be implemented.

Referring to FIG. 2, which illustrates an exemplary computer system 10 upon which a correct shell generation tool as disclosed herein, could be installed and/or used. Computer system 20 is illustrated as a networked computer system that includes one or more client computers 22, 24 and 30 such as workstations coupled through a network 28 to a server 26. Server 26 could also be a personal computer, a workstation, a midrange computer, or a mainframe computer. While shown here as a point-to-point connection, computers 22 and 24 need not be coupled to server 26 directly, but may be coupled to yet another network which in turn is connected to server 26. Network 28 represents any type of networked interconnection including but not limited to local-area, wide-area, wireless, and public networks such as the Internet or an Intranet, and any number of routers and hubs connected in between, e.g., a local-area network to a wide-area network to the Internet through a series of routers and/or other servers. Any number of computers and other devices may be networked through network 28, e.g., multiple servers, hand-held devices, etc.

Figure 1:
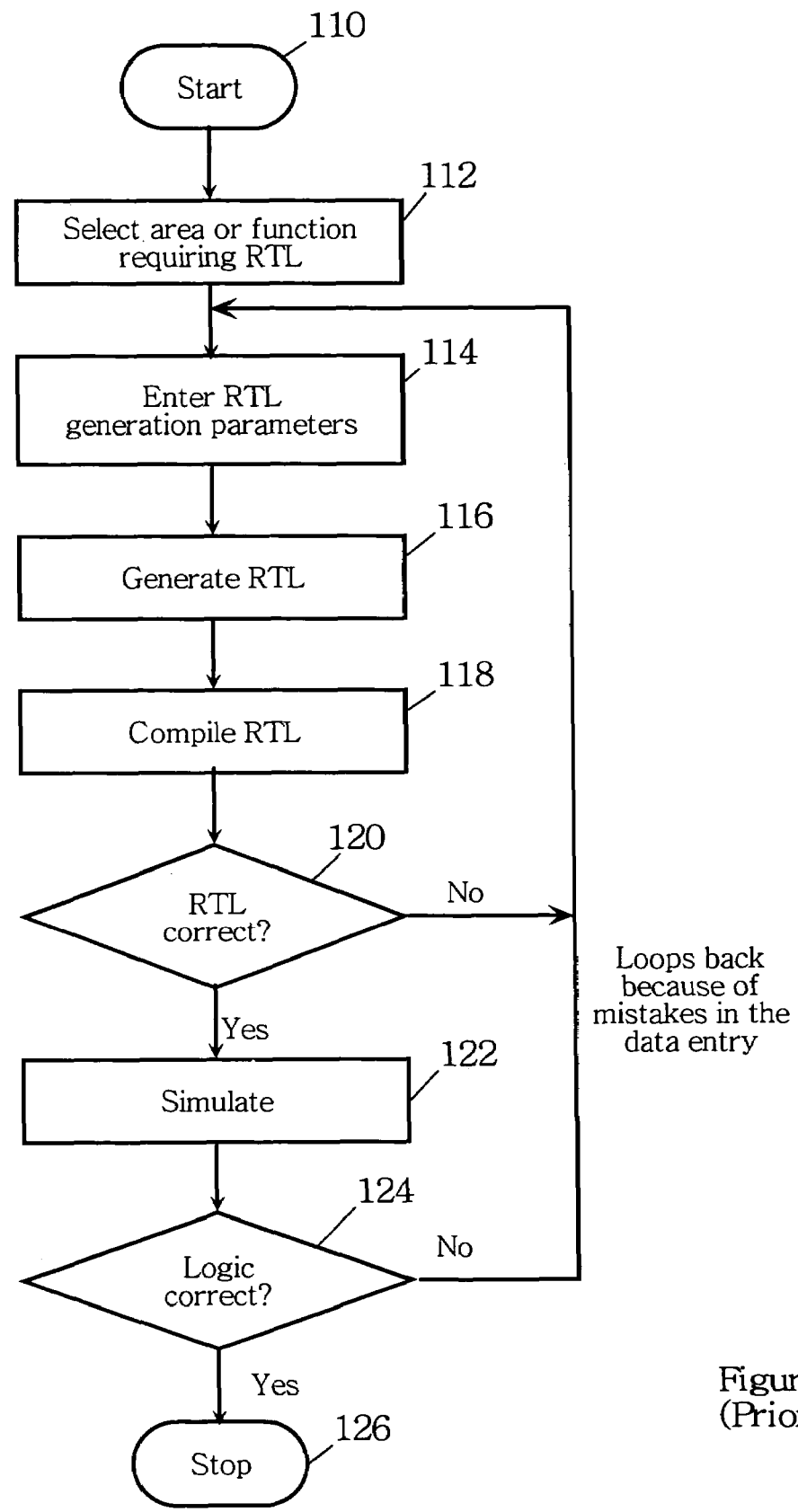
FIG. 1 is a simplified flow diagram of the conventional method of how RTL is generated during the development and design of integrated circuits.

For the purposes of the invention, computer 30 may represent practically any type of computer, computer system, or other programmable electronic device, including a client computer similar to computers 22, 24 of FIG. 1, a server computer, e.g., similar to server 26 of FIG. 1, a portable computer, an embedded controller, a hand-held device, etc. Computer 30 may be coupled in a network 28 as shown in FIG. 2 or may be a stand-alone device. Computer 30 will hereinafter also be referred to as a computer although it should be appreciated that the term "computer" may also include other suitable programmable electronic devices capable of allowing a chip designer to use the correct shell generation tool.

Figure 3:
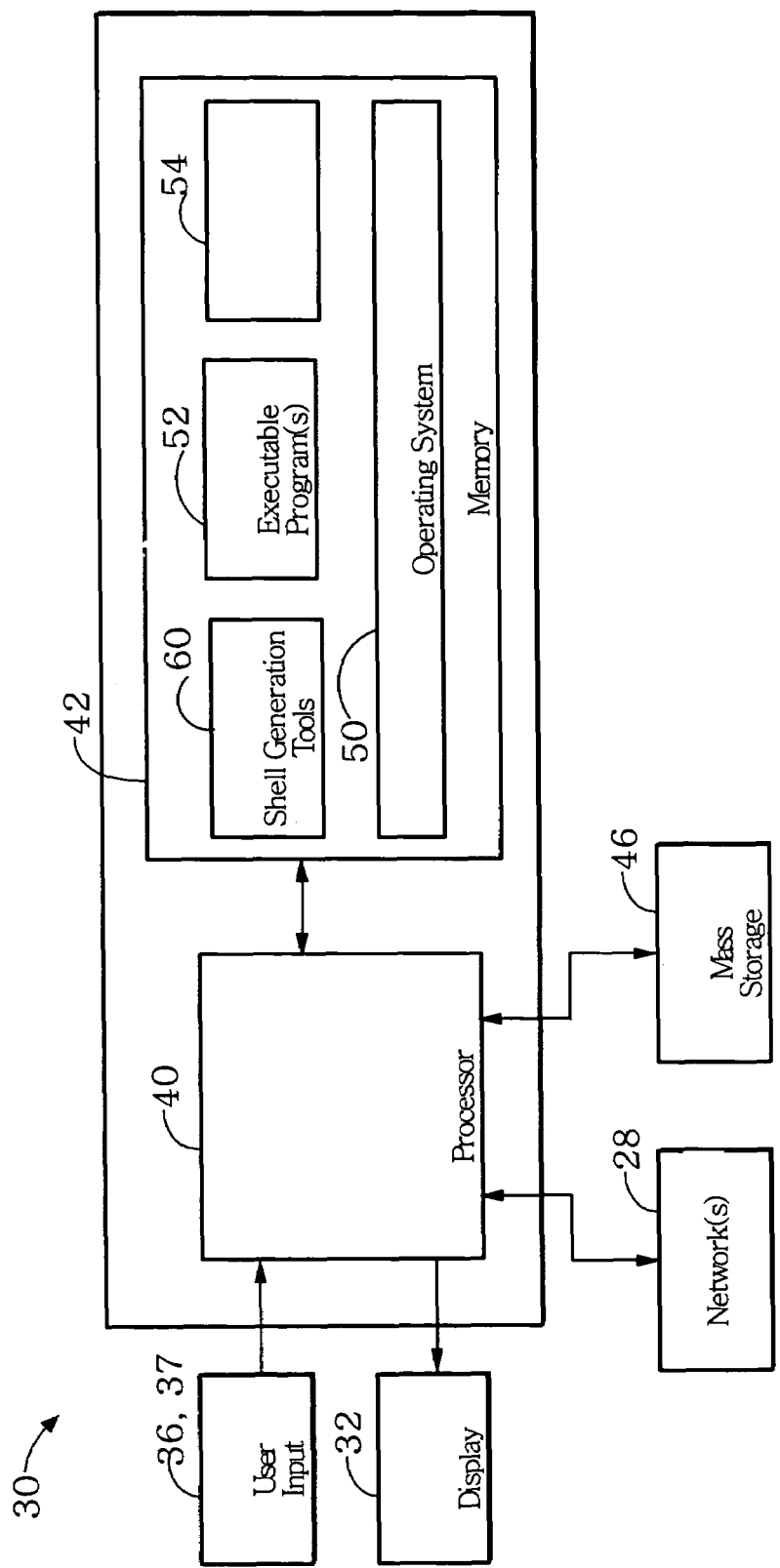
FIG. 3 is a simplified block diagram of the functional components within a computer workstation to which an integrated circuit developer may access and use the correct shell construction method and tool in accordance with an embodiment of the invention.

With reference to FIG. 3 wherein the method and apparatus of correctly generating shells for a semiconductor product during design as disclosed herein is installed as an application on computer 30. Computer 30 typically receives a number of inputs and outputs for communicating information externally. For interface with a user or operator, computer 30 typically includes one or more user input devices 36, 37, e.g., a keyboard, a mouse, a trackball, a joystick, a touchpad, and/or a microphone, among others, and a display 32 such as a CRT monitor, an LCD display panel, and/or a speaker, among others. Some servers, however, do not support direct user input and output. For additional storage, computer 30 may also include one or more storage devices 46, e.g., a floppy or other removable disk drive, a hard disk drive, a direct access storage device, an optical drive, e.g., a CD drive, a DVD drive, etc., and/or a tape drive, among others, that may be connected directly or may be connected through a storage area network (SAN) or other network. Furthermore, computer 30 may include an interface connected to one or more networks 28, e.g., a local-area network, a wide-area network, a wireless network, and/or the Internet, among others, to permit communication of information with other computers 22, 24 coupled to the network 28. It should be appreciated that computer 30 typically includes suitable analog or digital interfaces between processor 30 and each of the components 28, 32, 36, 37, and 46 as is known in the art.

Computer 30 typically includes at least one processor 40 coupled to a memory 42. Processor 40 may represent one or more processors or microprocessors and memory 42 may represent the random access memory (RAM) devices comprising the main storage of computer 30, as well as any supplemental levels of memory such as cache memories, nonvolatile or backup memories, programmable or flash memories, read-only memories, etc. In addition, memory 42 may be considered to include memory storage physically located elsewhere in computer 30, e.g., any storage capacity used as a virtual memory, e.g., as stored on a mass storage device 46 coupled to computer 30 with a SAN or on another computer coupled to computer 30 via a network 28.

Computer 30 may operate under the control of an operating system 50 such as a UNIX-based, LINUX-based, or WINDOWS-based operating system, as is known in the art, but is not so limited by the particular operating system, or indeed need not be under the control of any operating system. Operating system 50 typically executes various computer software applications, components, programs, objects, modules, etc., such as an executable program 52, etc. Although the correct shell generation tool 60 may be in memory 42 for the purpose of developing an integrated circuit, it need not be. The processor 40 may access the correct shell generation tool 60, the required data, other various applications components, programs, objects, modules, etc., resident on one or more processors in another computer coupled to computer 30 via a network 28, e.g., in a distributed or client-server computing environment whereby the processing to implement the functions of the correct shell generation tool may be allocated to multiple computers over a network.

As will be appreciated by one of skill in the art, the present invention may be embodied as a method, data processing system, or computer program product. Accordingly, the present invention may take the form of an entirely hardware embodiment, an entirely software embodiment or an embodiment combining software and hardware aspects all generally referred to herein as a "circuit" or "module." Furthermore, the present invention may take the form of a computer program product on a computer-usable storage medium having computer-usable program code embodied in a tangible medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may execute entirely on the user's computer, partly on the user's computer, as a stand-alone software package, partly on the user's computer and partly on a remote computer or entirely on the remote computer. In the latter scenario, the remote computer may be connected to the user's computer through a network 28, for example, the Internet using an Internet Service Provider.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction that install and implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

In general, the correct shell generation tool 60 executed to implement the embodiments of the invention whether implemented as part of an operating system or a specific application, component, program, object, module, or sequence of instructions will be referred to herein as the correct shell generation tool. The correct shell generation tool typically comprises one or more instructions that are resident at various times in various memory and storage devices in a computer, and that, when read and executed by one or more processors in a computer network, cause that computer to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links.

One input to the correct shell generation tool is the application set. An application set is, inter alia, a description of the platform and several shells that make the platform useful to a chip designer. Viewing FIG. 4, a platform 410 is a partially manufactured semiconductor device in which the wafer layers up to the connectivity layers have been fabricated. The platform 410 comprises a base semiconductor wafer from, e.g., silicon, silicon-on-insulator, silicon germanium, gallium arsenide, other Type II, IIII, IV, and V semiconductors, etc. and is a piece of semiconductor material into which blocks or hardmacs have beer diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory 420-428, 430-438, data transceiver hardware such as I/O PHYs 440-446, clock factories including phase-locked loops (PLLs) 450, control I/Os 452, configurable input/output (I/O) hardmacs 454, 456; each of the hardmacs have an optimum arrangement and density of transistors to realize its particular function. The platform further comprises an area of transistor fabric 460 for further development of the platform 410 using a suite of generation tools, each of which may incorporate the correct shell generation tool as described herein. Transistor fabric 460 is an array of prediffused transistors in a regular pattern that can be logically configured by the suite of generation tools herein to achieve different functions. A cell refers to the personalization of the interconnect layers that instantiate the logic gates of the transistor fabric. A memory compiler (not shown) may have compiled some blocks of diffused memory 420-438 for specific sizes, timing requirements, connections, etc. The placement of these hardmacs, compiled memories, and the reserved areas of the transistor fabric 460 have been situated to achieve the desired timing and performance both within the platform and for the platform 410 to connect externally.

Figure 4:
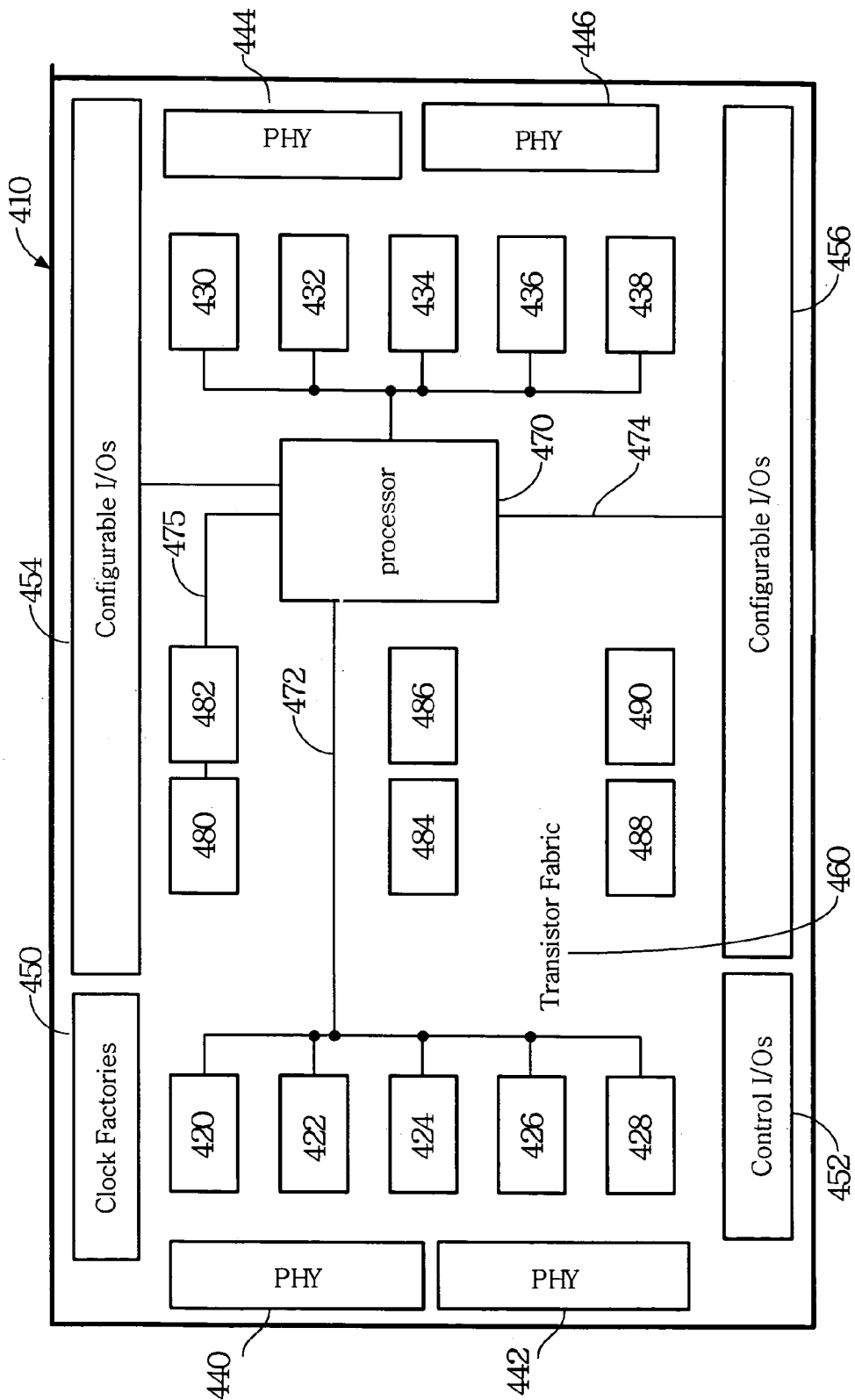
FIG. 4 is a simplified block diagram of a semiconductor platform having a number of components, each of which may be considered as generation tasks, having shells that may be correctly constructed by an embodiment of the invention.

One of skill in the art will appreciate that the platform 410 shown in FIG. 4 is only one example of a platform and its components. Different platforms may contain different amounts and arrangements of transistor fabric, different amounts of diffused and/or compiled memories, both fixed and configurable I/O blocks, clocks, etc. depending upon the purpose of the final integrated chip. For instance, if the final chip is intended to be a communication and/or network integrated circuit, the periphery of the platform may contain many I/O hardmacs that have been fixed as PHYs and/or that can be configured differently from one another. Likewise, if the final integrated chip is intended to be a specialized microprocessor then it may not have as many I/O hardmacs or configurable I/O, and more or less diffused registers and memories. The point is that there are different platforms for different semiconductor products. The platform 410, moreover, optionally may include the contact mask and some of the fixed higher layers of connectivity for distribution of power, ground, and external signal I/O.

The platform definition is a detailed listing of the features available on the platform, such as the area and availability of transistor fabric, the I/O and memory available, the requirements of the hardmacs, the cost of the platform, the ideal performance that can be expected of the platform, the expected power consumption, and other functional requirements. For memory elements, the platform definition may include, inter alia, details of: (a) area and physical placement of the memory array and its interface/connection pins; (b) bit width and depth; (c) organization, e.g., numbers of read/write ports, bit masking; (d) cycle time; and (e) power estimates. For I/O elements, the platform definition may provide, inter alia, the types of I/O, the I/O drive strength, etc. For clock elements, the platform definition provides the frequencies at which the platform may operate, the duty cycle, etc. Other details of the platform definition may include the configuration of the transistor fabric and the diffused and compiled elements, the status of the logic, the required control signals and the features enabled by the control signals, whether any element undergoes testing, the location and the number of the elements on the platform, etc.

The platform and its definition are of little use to a designer needing to develop a functional integrated circuit, so several representations of the diffused resources of the platform are needed; shells are these representations. Shells are the logic and other infrastructure that makes the platform useful as a design entity, and the correct shell generation tool described herein is preferably used to generate these shells. The platform description is input to circumscribe all other generated parameters and other user input to make the platform useful to design a semiconductor product. Using the correct shell generation tool and a suite of other generation tools, a chip designer can integrate her/his customer's requirements with the platform's resources and definition to verify and synthesize designs generated by each tool, insert clocks, create the test interconnects, and then integrate the designs together to create a complete design. The resultant design, moreover, is a qualified netlist with appropriate placement and routing amongst the existing resources and for external connections to a board. To create a customized chip, all that is needed is a small set of remaining masks to create the interconnections between the preplaced elements.

There are a number of shells used by a designer to integrate her/his customer's requirements using a particular platform description, and depending upon the designer's particular task; one or more of these shells can be used. While the following description is not intended to be limitative, it is nonetheless, fairly representative of the infrastructure necessary to use the platform and create a functional semiconductor product from the platform. These shells comprise: the RTL shells, the documentation shell, the verification shell, the synthesis shell, the static timing analysis shell, the manufacturing test shell, the floorplan shell, and the RTL qualification shell. The RTL shell provides a logical description of the platform, and the generated or user resources. The documentation shell may be considered the functional description of the resources. The verification shell is the functional verification description, and the synthesis shell may be thought of as the generation description. The static timing analysis shell is the timing description, the manufacturing test shell is the test description, and the floorplan shell is a location description of the platform resources.

Figure 5:
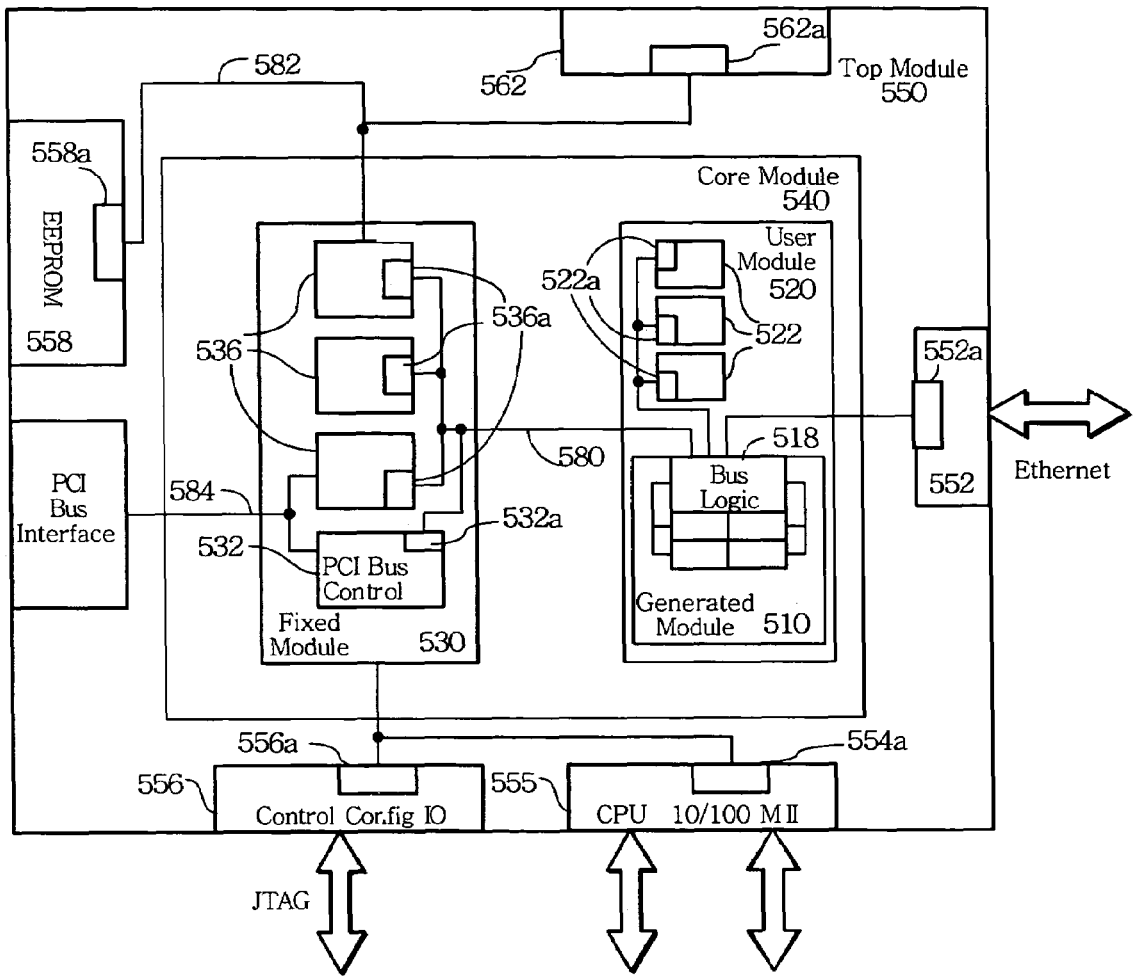
FIG. 5 is a simplified diagram illustrating the hierarchy of register transfer level logic of a platform description usable by the correct shell generation tool in accordance with an embodiment of the invention.

An additional perspective of these shells may be obtained by abstracting the semiconductor product as modules based upon the source of the RTL and the function of the logic, such as shown in FIG. 5. One of skill in the art will understand that these shells are not necessarily generated according to this or any other abstraction; that is to say, a generated verification shell or any other shell may have aspects in one or more of these modules and that the shells are not necessarily generated in the order of or limited to the following modules. The information is presented to show the complexity and the interconnectedness of the shells with each other throughout the semiconductor platform. The generated module 510 preferably comprises the shells generated by the correct shell generation tool herein and, e.g., a suite of generation tools for I/O, memory, clocks, or may be derived from other known semiconductor design tools. The generated module 510 may include some preplaced, timed, and proven components, such as one or more clock generators, system controllers and reset logic, test controllers, and/or analog serializers/deserializers (SERDES) hardmac components. The generated module 510 has connectivity requirements to the various modules and their components through bus logic 518 to the several modules along an internal bus 580 and/or external bus 582. Bus logic 518 may include arbiters, multiplexers, decoders, etc. to manage the connectivity and, if necessary, the address translation and register/memory coherence schemes.

The generated module may originate using the shell generation tool as described herein and a suite of generation tools as described in copending United States patent applications, commonly owned by the assignee herein and hereby incorporated by reference in their entireties: Ser. No. 10/435,168 filed 8 May 2003 entitled AUTOMATION OF THE DEVELOPMENT, TESTING, AND RELEASE OF A FLOW FRAMEWORK AND METHODOLOGY TO DESIGN INTEGRATED CIRCUITS, Ser. No. 10/318,792 filed 13 Dec. 2002 entitled FLEXIBLE TEMPLATE HAVING EMBEDDED GATE ARRAY AND COMPOSABLE MEMORY FOR INTEGRATED CIRCUITS; Ser. No. 10/318,623 filed 13 Dec. 2002 entitled AUTOMATED SELECTION AND PLACEMENT OF MEMORY DURING DESIGN OF AN INTEGRATED CIRCUIT; Ser. No. 10/334,568 filed 31 Dec. 2002 entitled PLACEMENT OF CONFIGURABLE INPUT/OUTPUT BUFFER STRUCTURES DURING DESIGN OF INTEGRATED CIRCUITS; Ser. No. 10/335,360 filed 31 Dec. 2002 entitled A SIMPLIFIED PROCESS TO DESIGN INTEGRATED CIRCUITS; Ser. No. 10/465,186 filed 19 Jun. 2003 entitled DESIGNING AND TESTING THE INTERCONNECTION OF ADDRESSABLE DEVICES OF INTEGRATED CIRCUITS; and Ser. No. 10/713,492 filed 14 Nov. 2003 entitled FLEXIBLE DESIGN FOR MEMORY USE IN INTEGRATED CIRCUITS.

Surrounding the generated module 510 is the user module 520. Logic from the customer for whom the integrated circuit is designed comprises the user module 520 and may include prefabricated logic and hardware such as cores, hardmacs, IOs, registers 522, etc. Also included in the user module 520 may be a list of memories and/or registers having tie-offs, i.e., the memories and/or registers that will not be used for data flow and may thus be allocatable for performance enhancing features such as control status registers, etc. The user module 520 also provides input into the correct shell generation tool described herein.

The fixed module 530 is created with the application set and thus encompasses the fixed resources of the application set. The fixed module 530 and its accompanying shells provide the template upon which the customer's requirements will be built and are input into the correct shell generation tool described herein. The fixed module 530 may be as simple as a logic signals directly connected to external chip I/Os, or it may be more complex logic upon which the user module 520 and the generated module 510 can build. For example, shells of the fixed module 530 could include the complete infrastructure to support a PCI bus controller 532, 532a including all the connections to external I/Os and/or a DDR/SRAM memory controller, a processor subsystem 536, 536a, etc. The correct shell generation tool herein accepts the shells of the fixed module 530 and then further facilitates matching and binding the memories, register blocks, any cores 536 in the fixed module to the top module 550, such as matching protocols and correctly binding the correct I/O hardmacs PHYs 552, such as an XGXS to support data transfer at Gigabit Ethernet speeds, or a MW SPI-4 core.

The core module 540 encompasses the fixed module 530 and the user module 520 and may be described as the correct and proven logic interfaces connecting them with each other and with the top module 550.

The top module 550 contains the logic and supporting shells for the hardmacs and configured logic towards the periphery of the platform for outside communication. The top module 550 thus contains the I/O blocks and I/O diffused areas and any registers associated with the hardmac and configurable I/Os. The instantiated I/O blocks that use the top module 550 may include the PLLs, the I/O netlists of which a NAND tree is a part, test logic, and lock detect circuits, etc. A number of input tables describing the interconnect templates are used by the correct shell generation tool to integrate the bus masters of 552a 554a, 556a, 558a, 562a of their respective top module components 552, 554, 556, 558, 562 with the application set and the rest of the design. These top module components may include a JTAG TAP controller 556, an Ethernet interface 552, a CPU connection interface 554, and/or an EEPROM interface 558, etc., each of which may require special consideration when inputting associated parameters.

Figure 6:
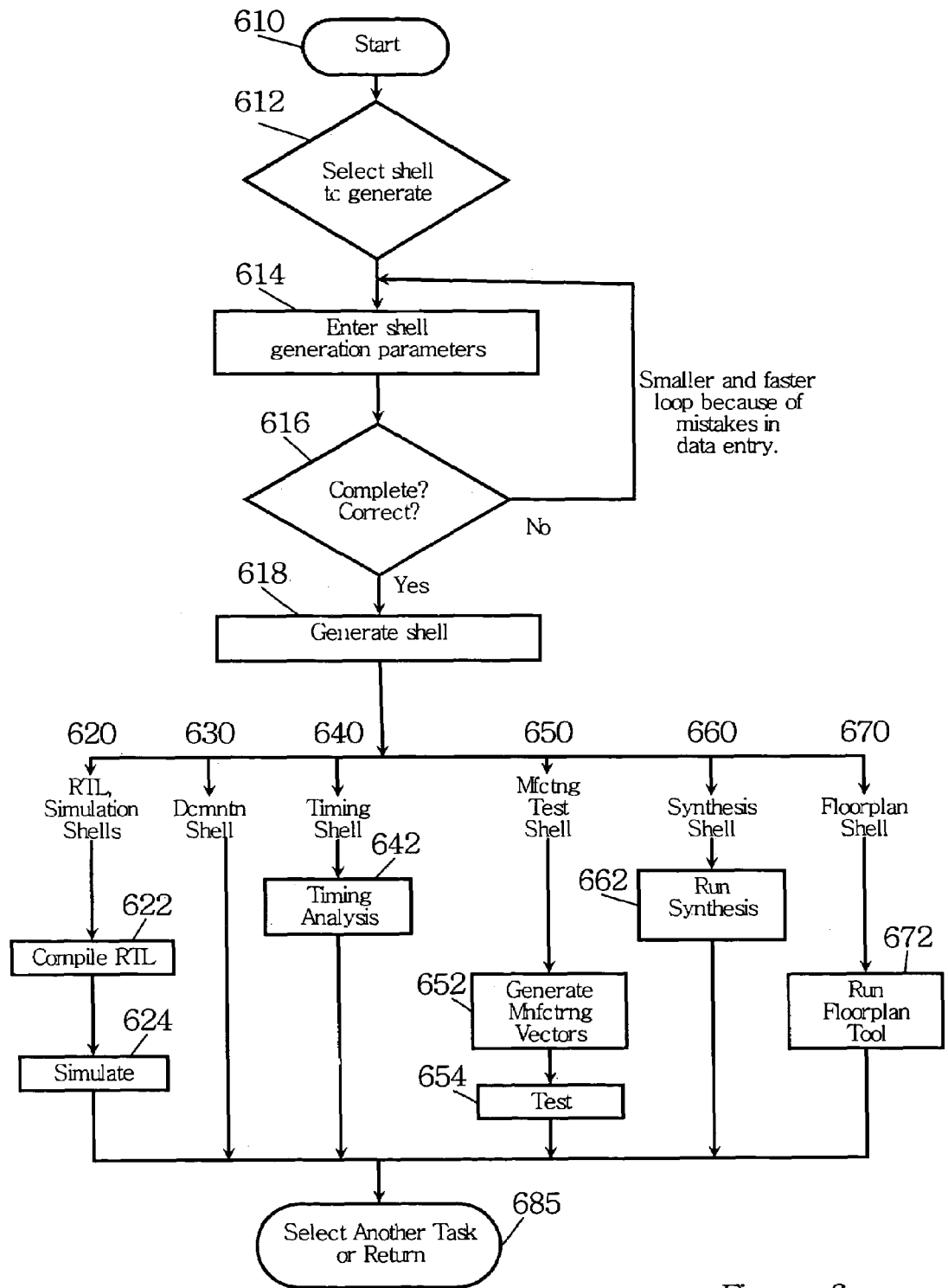
FIG. 6 is a simplified flow chart illustrating how a user can implement the correct shell generation tool in accordance with an embodiment of the invention.

FIG. 6 is a simplified flow chart of a method 600 of generating correct shells for the modules described in FIG. 5 and the platform of FIG. 4. In FIG. 6, the process begins at step 610 whereby the platform definition and user requirements of the user module and its shells are automatically input into the correct shell generation tool. The user selects a shell, such as an RTL, simulation, documentation shell, to generate at step 612. At step 614, the user enters the shell generation parameters associated with that shell, for example, the names of signals, names of inputs/outputs, etc. using one of several methods described with respect to FIG. 7. At this time, in contrast to the methodology of FIG. 1, the input parameters of the shells are checked to ensure their correctness and completeness at step 616. If the input parameters are not correct, then the process immediately loops back to step 614 giving the user an opportunity to enter correct shell parameters. If, however, the parameters for the shell are correct, then at step 618, the shell(s) is/are automatically generated. After the shell is generated, then different paths of FIG. 6 are taken depending upon the particular shell. For instance, if the correctly generated shell is an RTL and/or simulation shell, then at step 622, the RTL is compiled. Note, that at this time, the RTL language and syntax will be correct and need not be checked. Then, the RTL is then simulated as in step 624 to determine how the actual signals will transfer from register to register, and the process returns at step 685. After generation of the correct documentation shell 630, the process returns. The correct timing shell 640 will undergo timing analysis at 642 and return. The correct manufacturing test shell 650 generated by the tool as described herein can be used to generate manufacturing vectors at step 652 which will be tested at step 654. The correct synthesis shell 660 will be run at step 662, and the correct floorplan shell 670 will generate a floorplan as in step 672. The correct shell generation tool as described herein ensures that the parameters input into it and other generation tools are correct, complete and comply with any rules and constraints put upon them.

Figure 7:
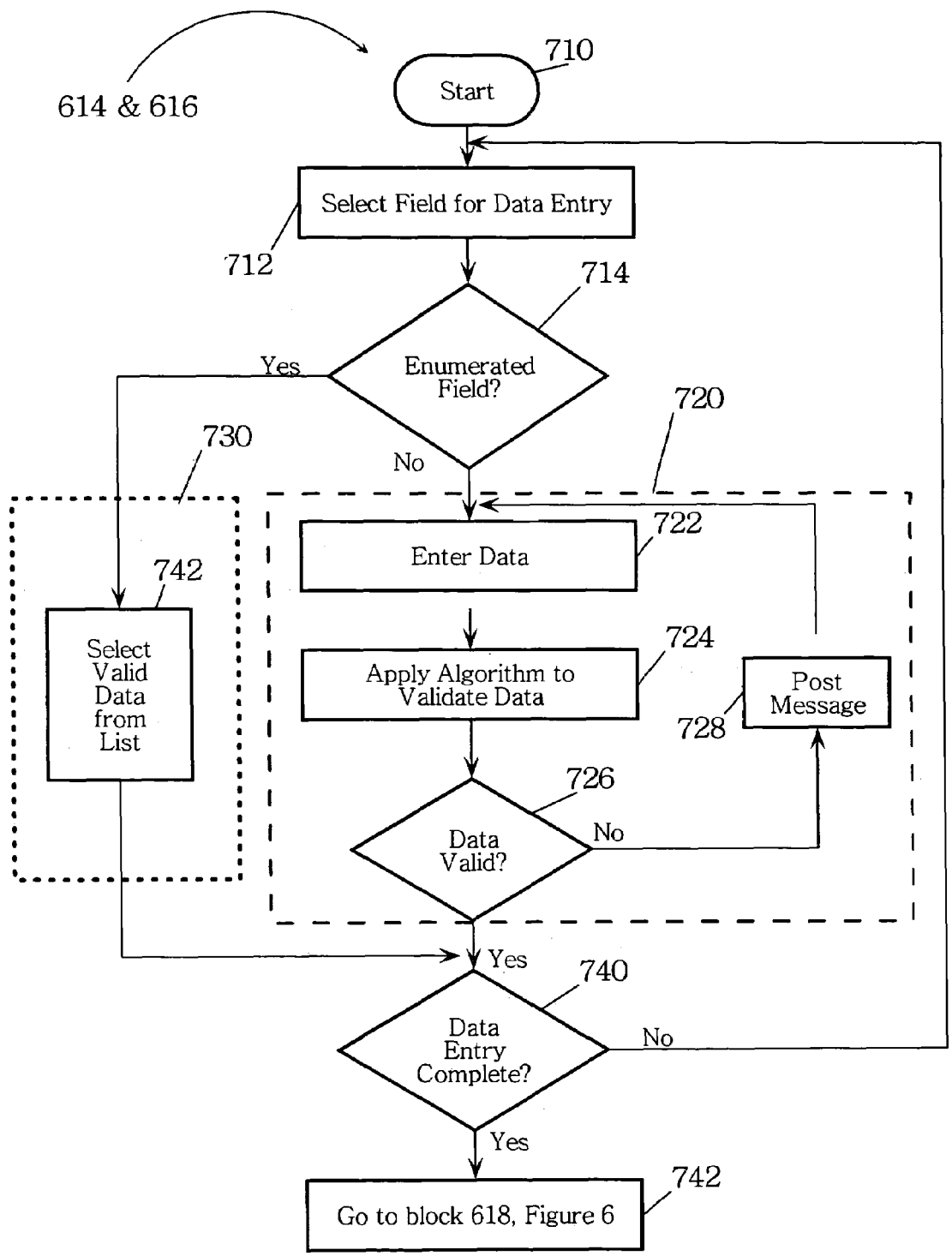
FIG. 7 is a more detailed flow chart of some steps of FIG. 6 that may be used by an embodiment of the invention to input correct parameters and generate correct shells for a semiconductor platform. It is suggested that FIG. 7 be printed on the face of the patent.

FIG. 7 is a simplified block diagram of steps 614 and 616 of FIG. 6 for inputting correct parameters into the correct shell generation tool. The process begins at step 710 and at step 712, the user may select a field for data entry. The field calls for a shell generation parameter and in the examples that follow, the correct shell generation tool will be generating the RTL shell for an adder, although the invention is not intended to be limited to generating only RTL shells. As shown in FIG. 6, a documentation shell, timing shell, synthesis shell, etc.

could also be generated for the adder. In one embodiment of the invention, the process checks if the input from the user may be a correct parameter already listed in an enumerated field, such as input derived from the platform definition and/or the customer requirements, as in step 714. If so, the process diverges to block 730.

Figure 9:
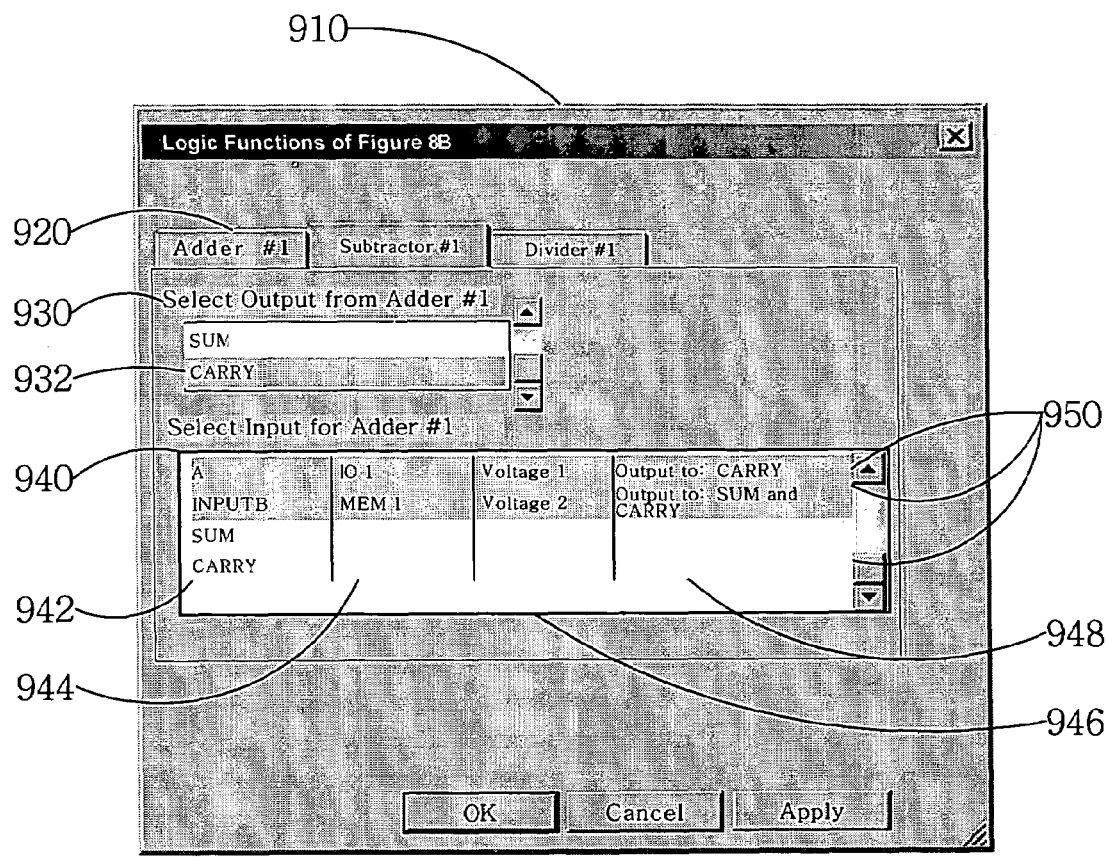
FIG. 9 is a graphical user interface embodying a technique that can be used by the correct shell generation tool to select correct input parameters in accordance with a feature of the invention.

But, if in block 714, the correct and acceptable parameters have not been listed and enumerated, as in a menu-driven graphical user interface, such as shown in FIG. 9, the method continues to block 720 and step 722 which requires the user to enter the shell parameters, whether they be RTL code or comments for documentation. In step 724, the appropriate algorithm to validate the input is called and in step 726, the called algorithm is applied to the entered parameters. If at step 726, the shell parameters are not correct, as determined by the rules and conventions of the hardware description language, such as IEEE Standard 1364 for Verilog and IEEE Standard 1076 for VHDL, the corporation and/or industry, a spell checker, the platform definition, customer requirements etc., then a message 728 is posted to the user. The message 728 may or may not offer suggestions for correcting the datum entered.

If, however, at step 726, the datum is correct, or if all the parameters have been selected from the list as in blocks 730, then at step 740, the process checks to see if there are additional entries to be made, such as additional input signals, additional logic functions on the input or output signals, additional areas of the chip, additional generation tasks, additional shell generation parameters, etc. Only when data entry is complete and when the data that has been entered has been validated and is determined to be correct, then does the process return to block 618 of FIG. 6 to generate the shell. Thus, correct parameters have been entered so that the correct-by-construction shells may be generated without the chip designers and developers having to go through lengthy iterations.

Figure 8A:
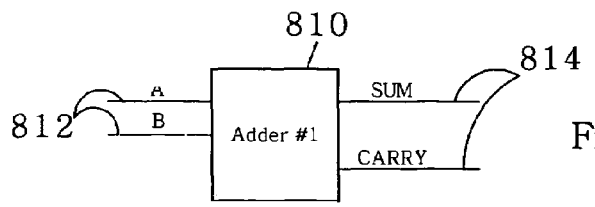
FIGS. 8a and 8b are physical representations of a circuit and FIG. 8c is a user interface that may be called by the correct shell generation tool to enter the parameters required by the tool in accordance with an embodiment of the invention.
Figure 8B:
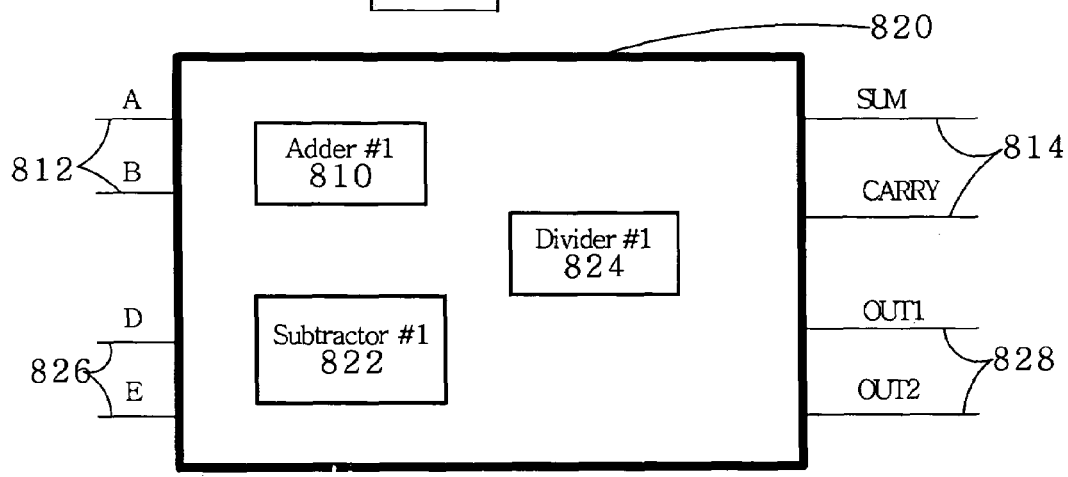
Figure 8C:
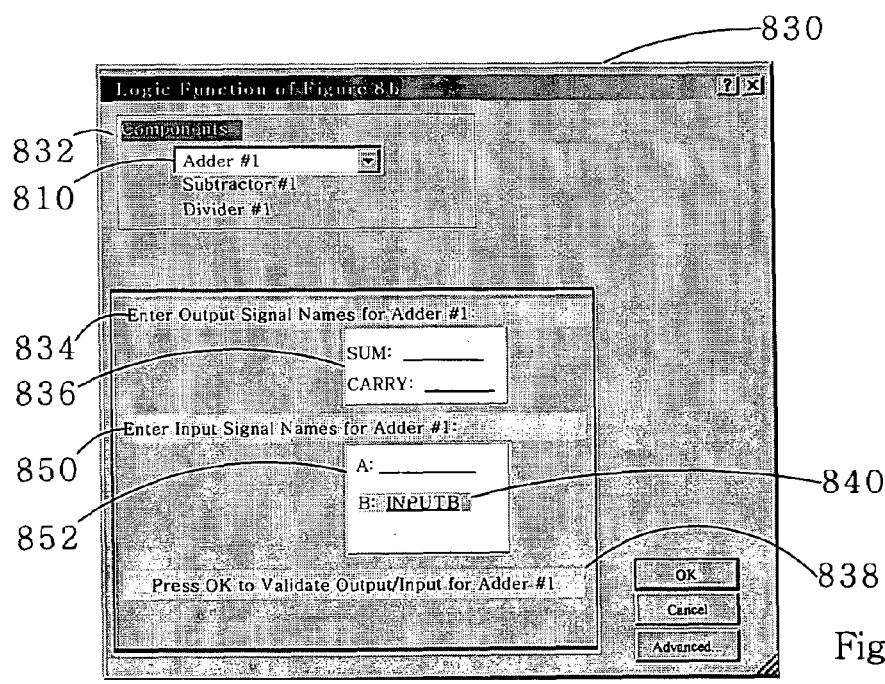

A simple Adder #1 810 is shown in FIG. 8*a* with input signals 812 A,B and output signals 814 of SUM and CARRY. Adder #1 810 will be used in a more complex logic circuit 820 comprising Adder #1 810, Subtractor #1 822, and Divider #1 824 shown in FIG. 8*b*. Other input signals 826 D and E are input to the logic circuit 820 that generates output signals 828 OUT1 and OUT2, as well as SUM and CARRY 824. FIG. 8*c* is an example of a simplified graphical user interface of how a correct shell can be generated for Adder #1 810 by, inter alia allowing only correct parameters to be entered into the shell generation tool in accordance with block 720 of FIG. 7. First, the user may select the logic function of FIG. 8*b* for data entry, as in step 712, at which time a user interface, such as a graphical user interface shown in FIG. 8*c* may arise. There may be input boxes 832 for selection of the component in which to enter parameters. There may be a directive to Enter Output 834 and an entry field 836 in which to enter the data, and a directive to Enter Input 850 and an entry field to enter a parameter 852, such as shown in which a user has just typed or spoken or otherwise entered the signal name, INPUTB 840 for input. B. There may be further directives 838 to initiate a validation algorithm whereby data entered into entry fields 836 and 852 are checked against the imposed constraints and rules.

Alternatively, at block 730, the user may enter data by selecting valid and correct parameters and values from, e.g., the platform definition and/or customer requirements already stored in the correct shell generation tool. Referring to FIG. 9, an example of a user interface 910, again for convenience, a graphical user interface is shown, appears to assist the user in selecting and entering the appropriate parameters. If the user wishes to generate the RTL for Adder #1 using the selection method of block 730, the user may simply select a folder 920 labeled Adder #1 and preferably menu-driven directions or a drop-down menu 930 will guide the user who may select an output CARRY 932 which will be entered into the correct shell generation tool. In a window 940, all the signals and corresponding variables of Adder #1, some of which may be selectable, e.g., correct names 942, source of the signals 944, correct voltage levels 946, the proper frequency or clock speeds (not shown), and its identification or function 948 to be entered into the tool are automatically displayed or otherwise presented to the user. It is preferred that all selectable variables of a particular parameter, of which a signal is only one example, are correctly displayed; and the user is given a choice of only valid and correct parameters and corresponding selectable correct variables to enter into the tool. In the example provided, the user has selected the highlighted input signals 950 for Adder #1.

The graphical user interfaces of FIGS. 8*c* and 9 are only simplified examples and are not intended to limit the invention to generating only an RTL shell for an adder, or to display only the signal parameters and their signal parameters and selectable variables. For instance a particular signal may have more than one voltage level and/or function and/or source or other selectable variable. The parameter of interest might not even be a signal, but might be a register, a cache line in an allocated memory, an I/O buffer, etc. Thus, the columns or rows may be replete with pulldown menus or other means to select these and other parameters and variables. The invention is not limited to entry fields only with a graphical user interface; other user interfaces, such as an audio response unit is intended to be within the scope of user interfaces.

Correct input is only one aspect of a correct shell generation tool that can be used to, e.g., generate and simulate the RTL, document, verify, provide information of manufacturing and testing, generate the timing shell and floorplan shell to provide an infrastructure within which to develop an integrated circuit and create the netlist of the chip. The correct shell generation tool checks or validates the entered data for correctness, completeness, and compliance with physical design constraints, test rules, language syntax, industry or corporate requirements, compatibility, interconnectedness and more to correctly configure memory, I/O buffers, diffused hardmacs, and clock resources for a semiconductor product. In the context of the applying the correct shell generation tool to a platform and application set, the tool can document, synthesize, test, simulate and configure I/Os and PLLs. Correct input for memory blocks facilitates the configuration of prediffused single-port and dual-port RAM available on the platform and generation of wrappers to organize and tile physical memory blocks of a desired depth and width to match design and testing such as BIST requirements.

Entry and checking of correct package pin assignment and configuration of i/O buffers, such as CMOS, impedance controlled buffers, SSTL, HSTL, LVDS, PECL, PCI, and others for a range of correct voltage levels is a snap with either method of parameter entry disclosed herein. The user simply selects or enters a correct signal name and package ball and other required parameters, and the desired I/O configuration, as well as documentation, testing, simulation, etc. for instantiating 110 buffers, boundary scan cells, JTAG TAP controller, and clock structures are generated.

The correct shell generation tool automates the generation of correct-by-construction clock factories by giving the designer a selection of or requiring the designer to input correct data such as oscillator and reset sources, coefficients for frequency division/multiplication, and clock power-down modes. The designer simply inputs or selects the correct clock features, and the resultant RTL and other shells having correct delay matching across different generated clocks from the same PLL, and clock branch gating for different power modes are instantiated into the design of the integrated circuit.

The various embodiments of the present invention described above have been presented by way of example and not limitation. The breadth and scope of the present invention is not limited by the included exemplary embodiments, but should be defined only in accordance with the following claims and their equivalents.

What is claimed is:

1. A method of generating a correct shell, via a correct shell generation tool, for the design of a semiconductor product, the method comprising the steps of:
   (a) receiving and storing a definition of a platform from which the semiconductor product will be designed;
   (b) receiving and storing a customer's requirements and shell data for the semiconductor product;
   (c) receiving a first user input, said first user input provided by a user and requesting a shell to be generated for the design of the semiconductor product;
   (d) providing a field for entry of shell parameter data by the user;
   (e) receiving a second user input, said second user input including shell parameter data;
   (f) prior to generation of the requested shell, automatically determining if the shell parameter data is correct and complete, wherein determining if the shell parameter data is correct and complete includes checking the shell parameter data against the stored shell data, and further includes at least one of checking syntax of the shell parameter data against rules of a hardware description language, and checking if the entered shell parameter data complies with at least one of customer data conventions and corporate data conventions;
      when the correct shell generation tool determines that the shell parameter data is at least one of: incorrect and incomplete, prompting the user to provide a third user input including corrected shell parameter data; and
      when the correct shell generation tool determines that the shell parameter data is correct and complete, generating the requested shell.

2. The method of claim 1, wherein the generated shell provides an infrastructure for the memory of the semiconductor product.

3. The method of claim 2, wherein the infrastructure configures the memory into random access memory of a desired depth and width.

4. The method of claim 1, wherein the generated shell provides an infrastructure for the I/O of the semiconductor product.

5. The method of claim 4, wherein the infrastructure for the I/O further comprises correct package pin assignment for a portion or all of semiconductor product.

6. The method of claim 4, wherein the infrastructure further configures one or more I/O buffers for one or more impedance levels.

7. The method of claim 4, wherein the infrastructure further enables enabling boundary scan-testing.

8. The method of claim 1, wherein the generated shell provides an infrastructure for the clocking of the semiconductor product.

9. The method of claim 8, wherein the infrastructure provides delay matching across one or more clock signals from a same phase locked loop.

10. The method of claim 8, wherein the infrastructure provides for branch gating of clock signals for one or more power modes of the semiconductor product.

11. The method of claim 1 wherein the step of providing a field into which a user may enter data further comprises:
    (a) offering the user acceptable and correct data from which to select given the field.

12. The method of claim 1, wherein the step of providing a field into which a user may enter data further comprises providing a user interface into which the user can input data.

13. The method of claim 12 wherein the step of determining that the entered data is correct further comprises applying an algorithm dependent upon the shell that validates the input data.

14. The method of claim 13 wherein the shell is an RTL shell and the algorithm validates the correctness of the input data written in a hardware description language.

15. A tool for generating a correct shell for the design of a semiconductor product, comprising:
    means for receiving and storing a definition of a platform from which the semiconductor product will be designed;
    means for receiving and storing a customer's requirements and shell data for the semiconductor product;
    means for receiving a first user input, said first user input provided by a user and requesting a shell to be generated for the design of the semiconductor product;
    means for providing a field for entry of shell parameter data by the user;
    means for receiving a second user input, said second user input including shell parameter data;
    means for automatically determining if the shell parameter data is correct and complete prior to generation of the requested shell, wherein determining if the entered shell parameter data is correct and complete includes checking the shell parameter data against the stored shell data and further includes at least one of checking syntax of the entered shell parameter data against rules of a hardware description language, and checking if the entered shell parameter data complies with at least one of customer data conventions and corporate data conventions;
    means for prompting the user to provide a third user input including corrected shell parameter data when the tool determines that the shell parameter data is at least one of: incorrect and incomplete; and
    means for generating the requested shell when the tool determines that the shell parameter data is correct and complete.

* * * * *